(12) United States Patent  (10) Patent No.: US 8,469,735 B2
Dargatz  (45) Date of Patent: Jun. 25, 2013

(54) MOUNTING RAIL AND POWER DISTRIBUTION SYSTEM FOR USE IN A PHOTOVOLTAIC SYSTEM

(75) Inventor: Marv Dargatz, Auburn, CA (US)

(73) Assignee: Enphase Energy, Inc., Petaluma, CA (US)

( * ) Notice: Subject to any disclaimer, the term of this patent is extended or adjusted under 35 U.S.C. 154(b) by 554 days.

(21) Appl. No.: 12/592,889

(22) Filed: Dec. 4, 2009

(65) Prior Publication Data

US 2010/0139945 A1  Jun. 10, 2010

Related U.S. Application Data

(60) Provisional application No. 61/200,845, filed on Dec. 4, 2008.

(51) Int. Cl.
*H01R 11/20* (2006.01)
(52) U.S. Cl.
USPC ........................... 439/426; 439/110; 136/244
(58) Field of Classification Search
USPC ................ 439/110, 111, 114, 115, 120, 426, 439/736; 136/144, 251; 52/46.5; 29/883
See application file for complete search history.

(56) References Cited

U.S. PATENT DOCUMENTS

| | | | | |
|---|---|---|---|---|
| 2,117,816 A | * | 5/1938 | Gordon | 439/120 |
| 2,175,145 A | * | 10/1939 | Davison | 439/216 |
| 2,175,245 A | * | 10/1939 | Brockman | 439/111 |
| 2,267,610 A | * | 12/1941 | Jone, Sr. | 439/120 |
| 2,284,097 A | * | 5/1942 | Jone, Sr. | 439/115 |
| 2,361,721 A | * | 10/1944 | Van Deventer | 439/120 |
| 2,441,461 A | * | 5/1948 | Wayne | 439/115 |
| 2,464,964 A | * | 3/1949 | Charap | 439/120 |
| 2,617,848 A | * | 11/1952 | Malone | 439/113 |
| 2,688,737 A | * | 9/1954 | Oskerka, Jr. et al. | 439/736 |
| 2,979,686 A | * | 4/1961 | Longmire | 439/115 |
| 3,015,795 A | * | 1/1962 | Meacham | 439/94 |
| 3,089,042 A | * | 5/1963 | Hickey et al. | 307/147 |
| 3,214,579 A | * | 10/1965 | Pacini | 362/227 |
| 3,488,621 A | * | 1/1970 | Stevens | 439/114 |
| 3,489,981 A | * | 1/1970 | Corl et al. | 439/116 |
| 3,720,778 A | * | 3/1973 | Woertz et al. | 174/59 |
| 3,771,103 A | * | 11/1973 | Attema | 439/110 |
| 3,983,407 A | * | 9/1976 | Shott | 307/146 |

(Continued)

FOREIGN PATENT DOCUMENTS

| | | |
|---|---|---|
| JP | 08-018085 | 1/1996 |
| JP | 11-22127 | * 1/1999 |
| JP | 2006-278672 | 10/2006 |
| WO | WO 2008/108909 A1 | 9/2008 |

OTHER PUBLICATIONS

International Search Report and Written Opinion Mailed Jun. 30, 2010 for PCT Application No. PCT/US2009/066746.

(Continued)

*Primary Examiner* — Neil Abrams
(74) *Attorney, Agent, or Firm* — Moser Taboada

(57) ABSTRACT

Apparatus for coupling generated power to an output load. The apparatus comprises a first mounting rail, adapted for electrically coupling a power element to the output load. The first mounting rail comprises a frame defining a cavity; an insulative material disposed within at least a portion of the cavity; and a first at least two conductors, encapsulated within the insulative material, adapted for coupling power from the power element to the output load.

20 Claims, 7 Drawing Sheets

U.S. PATENT DOCUMENTS

| | | | | |
|---|---|---|---|---|
| 4,217,018 A | * | 8/1980 | Yoshida et al. | 439/118 |
| 4,367,417 A | * | 1/1983 | Casasanta | 307/147 |
| 4,433,200 A | * | 2/1984 | Jester et al. | 136/251 |
| 4,633,032 A | * | 12/1986 | Oido et al. | 136/251 |
| 4,688,154 A | * | 8/1987 | Nilssen | 362/147 |
| 5,151,043 A | * | 9/1992 | Morgan | 439/212 |
| 5,353,209 A | * | 10/1994 | Foottit | 362/648 |
| 5,372,522 A | * | 12/1994 | Hoeft | 439/535 |
| 5,423,694 A | * | 6/1995 | Jensen et al. | 439/417 |
| 5,709,559 A | * | 1/1998 | Fujitani et al. | 439/130 |
| 5,951,785 A | * | 9/1999 | Uchihashi et al. | 136/251 |
| 6,065,255 A | | 5/2000 | Stern et al. | |
| 6,093,884 A | * | 7/2000 | Toyomura et al. | 136/244 |
| 6,201,180 B1 | * | 3/2001 | Meyer et al. | 136/244 |
| 6,344,612 B1 | * | 2/2002 | Kuwahara et al. | 174/50 |
| 6,465,724 B1 | | 10/2002 | Garvison et al. | |
| 6,528,728 B1 | * | 3/2003 | Shima | 174/101 |
| 6,649,822 B2 | * | 11/2003 | Eguchi et al. | 136/251 |
| 6,716,042 B2 | * | 4/2004 | Lin | 439/110 |
| 6,960,716 B2 | * | 11/2005 | Matsumi et al. | 136/244 |
| 7,503,522 B2 | * | 3/2009 | Henley et al. | 244/118.5 |
| 7,824,191 B1 | * | 11/2010 | Browder | 439/76.1 |
| 8,196,360 B2 | * | 6/2012 | Metten et al. | 52/173.3 |
| 8,227,684 B2 | * | 7/2012 | Truman et al. | 136/251 |
| 8,227,942 B2 | * | 7/2012 | Marroquin et al. | 307/147 |
| 8,257,106 B2 | * | 9/2012 | Fornage et al. | 439/357 |
| 2007/0102038 A1 | * | 5/2007 | Kirschning | 136/251 |
| 2010/0139945 A1 | * | 6/2010 | Dargatz | 174/116 |

OTHER PUBLICATIONS

"Inverters, Converters, Controllers and Interconnection System Equipment for Use With Distributed Energy Resources", UL 1741, p. 1, Nov. 2007.

"Performance Test Protocol for Evaluating Inverters Used in Grid-Connected Photovoltaic Systems", Ward Bower et al., dated Oct. 2004, pp. 1-41.

"IEEE Recommended Practice for Utility Interface of Photovoltaic (PV) Systems"; IEEE Std 929-2000, pp. 1-26, Jan. 2000.

* cited by examiner

MOUNTING RAIL AND POWER DISTRIBUTION SYSTEM FOR USE IN A PHOTOVOLTAIC SYSTEM

CROSS-REFERENCE TO RELATED APPLICATIONS

This application claims benefit of U.S. provisional patent application Ser. No. 61/200,845, filed Dec. 4, 2008, which is herein incorporated in its entirety by reference.

BACKGROUND OF THE INVENTION

1. Field of the Invention

Embodiments of the present invention generally relate to power distribution and, more particularly, to a mounting rail and AC power distribution system for use in a photovoltaic system.

2. Description of the Related Art

Photovoltaic (PV) systems comprise a plurality of PV modules arranged in an array and coupled to one or more DC-to-AC inverters. One particular type of PV system uses a plurality of PV modules and a plurality of inverters, where each PV module is coupled to an inverter forming an integrated PV module. In such a system, the DC power produced by each PV module is converted to AC power at a location proximate the PV module (e.g., on a rooftop). The AC power generated by each inverter is combined and ultimately coupled to a point of common connection (PCC) at the installation site.

The arrangement of inverters within a rooftop array necessitates running wire, cable, and conduit across the roof. A typical installation uses a rigid mounting rail to mechanically attach the PV modules to the roof or other mounting structures. An AC cable that couples the inverters to one another is "tie wrapped" to the mounting rail. Since cable lengths are not exact, extra cable must be looped and tie wrapped to prevent mechanical damage. This installation process is complex, labor intensive, and can lead to installation errors.

In order to simplify the installation process of a PV system, there is a need for an integrated PV module mounting rail and AC power distribution system.

SUMMARY

Embodiments of the present invention generally relate to an apparatus for coupling generated power to an output load. The apparatus comprises a first mounting rail, adapted for electrically coupling a power element to the output load. The first mounting rail comprises a frame defining a cavity; an insulative material disposed within at least a portion of the cavity; and a first at least two conductors, encapsulated within the insulative material, adapted for coupling power from the power element to the output load.

DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
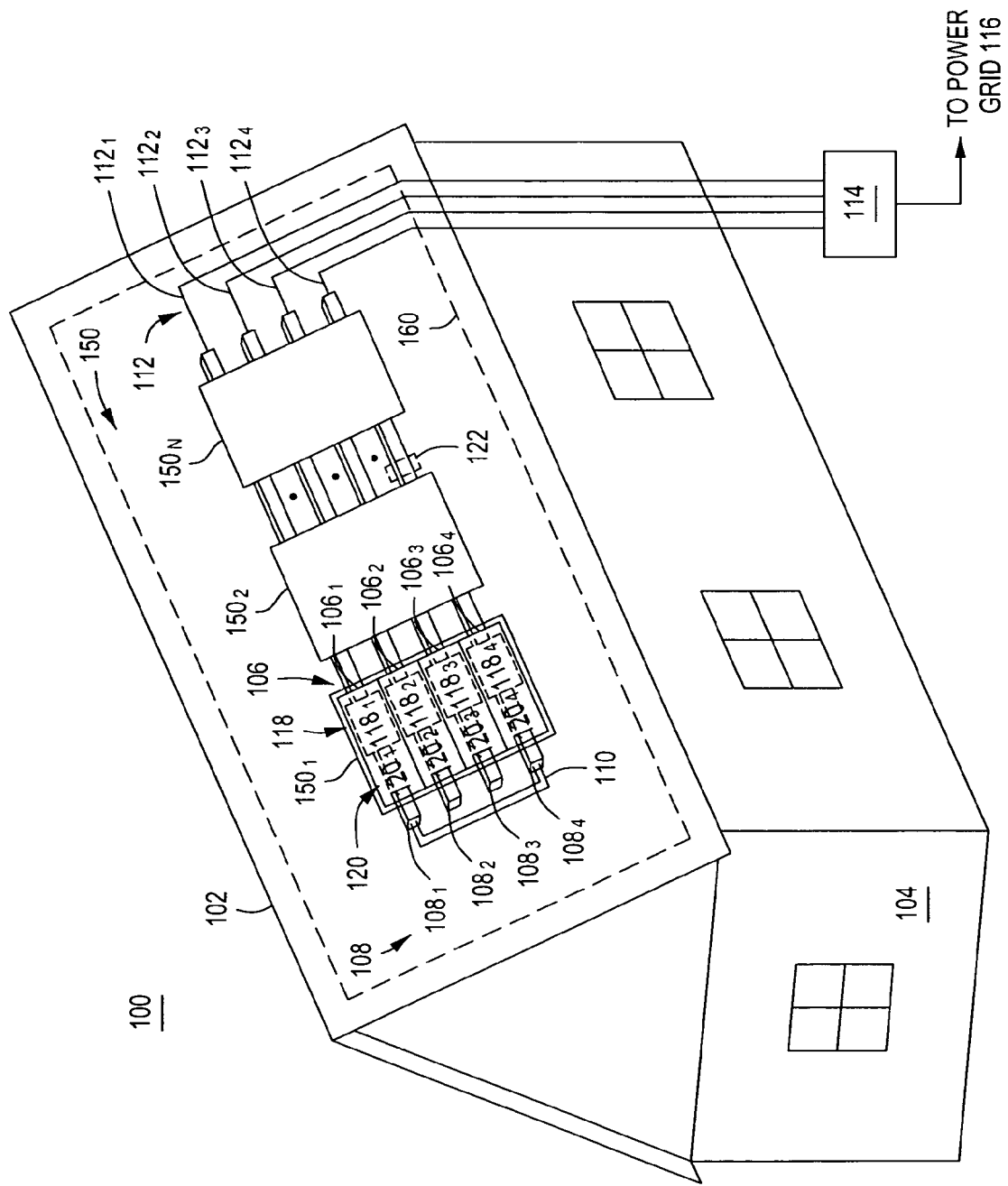
FIG. 1 is a block diagram of a system for coupling generated power to an output load in accordance with one or more embodiments of the present invention.

FIG. 1 is a block diagram of a system 100 for coupling generated power to an output load in accordance with one or more embodiments of the present invention. The system 100 comprises a building 104, a roof 102 of the building, and a photovoltaic (PV) array 160 mounted upon the roof 102. Such rooftop mounting of PV arrays is common; however, the PV array 160 may be mounted in other locations utilizing various embodiments of the present invention.

The PV array 160 comprises a mounting assembly 110, integrated PV module mounting rails $108_1$, $108_2$, $108_3$, and $108_4$, collectively referred to as mounting rails 108, and a plurality of PV panels $150_1$, $150_2$, ..., $150_n$, collectively referred to as PV panels 150. The mounting assembly 110 supports the mounting rails 108, upon which the PV panels 150 are mounted in a horizontal arrangement.

Each PV panel 150 comprises a PV module $120_1$, $120_2$, $120_3$, and $120_4$, collectively referred to as PV panels 120, arranged vertically within the PV panel 150, The PV modules $120_1$, $120_2$, $120_3$, and $120_4$ are coupled to power modules $118_1$, $118_2$, $118_3$, and $118_4$ (collectively referred to as power modules 118), respectively; in some alternative embodiments, the PV modules $120_1$, $120_2$, $120_3$, and $120_4$ may be coupled together to form a single DC output that is coupled to a single power module 118.

In some embodiments, such as the embodiment described herein, the power modules $118_1$, $118_2$, $118_3$, and $118_4$ are inverters (collectively referred to as inverters 118) mechanically mounted to a corresponding PV panel $120_1$, $120_2$, $120_3$, and $120_4$ to form integrated PV modules $106_1$, $106_2$, $106_3$, and $106_4$ (collectively referred to as integrated PV modules 106). The inverters 118 are further electrically coupled to the PV modules 120 for inverting DC current generated by the PV modules 120 to produce AC output current. Additionally or alternatively, a DC/DC converter may be coupled between each PV module 120 and the corresponding inverter 118 (i.e., one DC/DC converter per inverter 118). In some embodiments, the inverters 118 may be electrically coupled to the PV modules 120 but not mechanically mounted to the PV modules 120.

In accordance with one or more embodiments of the present invention, the inverters 118 are coupled to the mounting rails 108 such that the generated AC output current is distributed within the PV array 160 via the mounting rails

108, as described in detail further below. Each mounting rail 108₁, 108₂, 108₃, and 108₄ is terminated into a cable 112₁, 112₂, 112₃, and 112₄ (collectively referred to as cables 112), respectively, for carrying the generated AC power to a point of common connection (PCC)—typically, a power meter 114. The power meter 114 further couples the AC power to commercial power grid 116 and/or to appliances within the building 104.

Generally, mounting rails 108 are vertically arranged in a group where the number of mounting rails 108 is equivalent to the number of integrated PV modules 106 within the mounted PV panels 150 (i.e., each integrated PV module 106 of a particular PV panel 150 is coupled to a different mounting rail 108). Alternatively, fewer or more mounting rails 108 than the number of integrated PV modules 106 within a particular PV panel 150 may be installed in a group of mounting rails 108.

The PV array 160 may further comprise additional groups of mounting rails 108, for example one or more additional groups of four mounting rails 108, deployed in a vertical arrangement for supporting additional PV panels 150. In some embodiments, multiple mounting rails 108 may be mechanically and electrically connected in series in a horizontal direction (i.e., end-to-end) by a coupling mechanism 122 to facilitate mounting additional PV panels 150 in a horizontal direction. In other embodiments, the coupling mechanism 122 may be utilized to serially couple one or more mounting rails that are vertically arranged.

In one or more alternative embodiments, DC/DC converters and/or DC junction boxes may be utilized in place of or in addition to the inverters 102. For example, DC/DC converters or DC junction boxes may be coupled to each PV module 120 and further coupled to the mounting rails 108 for distributing DC power from the PV modules 120 within the PV array 160. In other alternative embodiments, the PV modules 120 may be adapted for directly coupling the generated DC power from the PV modules 120 to the mounting rails 108. The mounting rails 108 may thus be coupled to a plurality of different power elements (DC/AC inverters, DC/DC converters, DC junction boxes, PV modules) for distributing the power from the power elements, e.g., to an output load.

Figure 2:
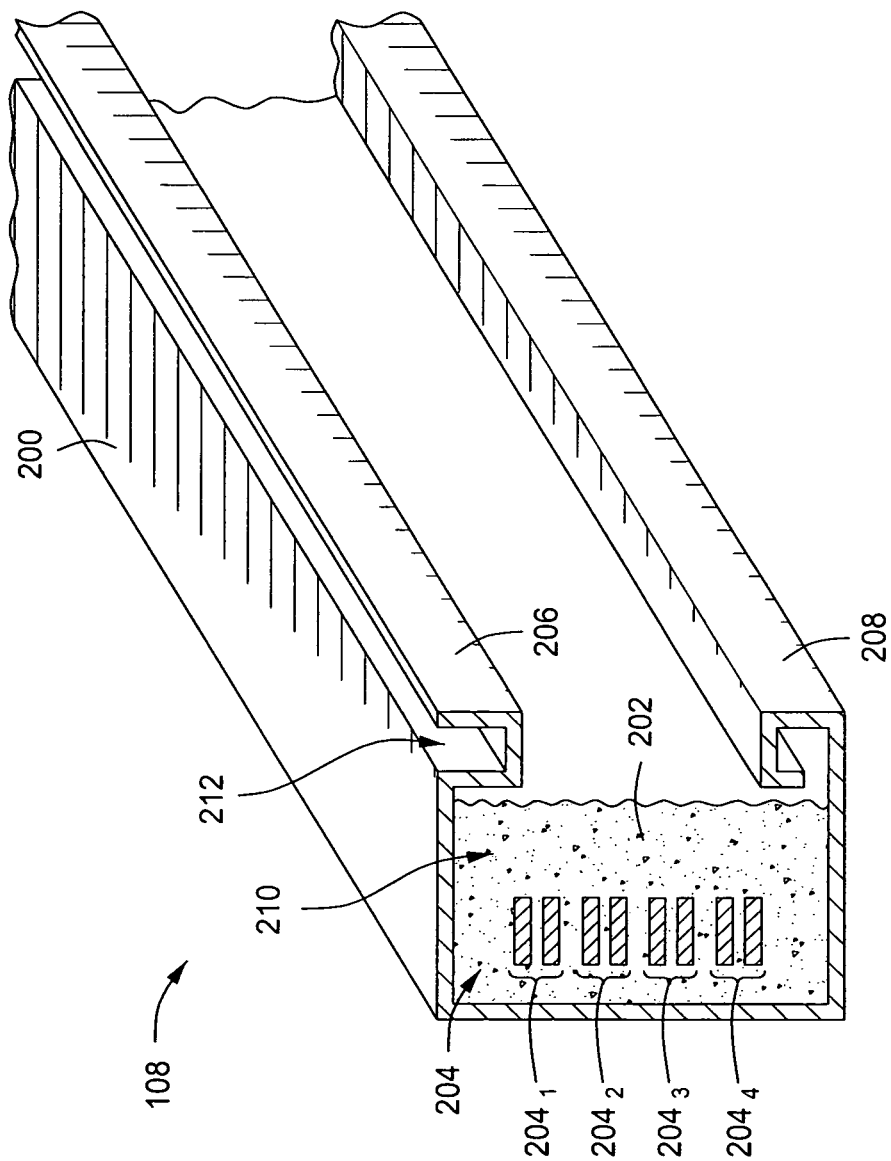
FIG. 2 depicts a perspective view of a mounting rail in accordance with one or more embodiments of the present invention.

FIG. 2 depicts a perspective view of a mounting rail 108 in accordance with one or more embodiments of the present invention. The mounting rail 108 comprises a frame 200, conductors 204₁, 204₂, 204₃, and 204₂ (collectively referred to as conductors 204), and an insulative fill material 202 ("insulative material 202"). In some embodiments, the frame 200 is manufactured from an extruded material, such as aluminum, a rigid plastic, or the like, and is in the form of an elongated trough defining an open area 210 (i.e., a cavity). The frame 200 may have any cross sectional shape—a rectangular shape is shown in FIG. 2, but other shapes such as hemispherical, triangular, or the like are also applicable.

The frame 200 comprises mounting flanges 206 and 208 upon which an inverter 118, either by itself or as part of an integrated PV module 120, is mounted, for example, as described below with respect to FIG. 7. In some embodiments, mounting flange 206 is U-shaped having an open trough 212 that may be used for bracket-mounted PV modules, although the form of mounting flange 206 and/or mounting flange 208 may be considered a design choice and can be adapted to conform to any PV module and/or inverter mounting technique.

The conductors 204 are elongated bus bars that extend the length of the frame 200 for coupling the AC power generated by the inverters 118 to the cables 112. The conductors 204 may be fabricated from copper, aluminum, or other conductive materials. In one embodiment, each of the conductors 204 comprises a pair of bus bars that carry a phase of AC power or a neutral line. In some embodiments, the conductors 204₁, 204₂, and 204₃, each carry a phase of three-phase AC power, and conductor pair 204₄ forms a neutral. In other embodiments, one or more of the conductors 204 may carry AC power (e.g. single-phase, split phase, and the like) or DC power while one or more of the conductors 204 remain unused (i.e., not coupled to an inverter or DC/DC converter); alternatively, the frame 200 may comprise fewer conductors 204 for carrying various types of AC power or DC power, The conductors 204 are sealed (i.e., encapsulated) within the insulative material 202 that substantially fills the open area 210 of the frame 200. The insulative material 202 comprises a potting material, such as polyurethane, an insulative polymer having limited moisture absorption properties, or similar material, that is generally applied as a fluid and that cures into a hard or substantially resilient material. By sealing the conductors 204 within the insulative material 202, the conductors 204 remain in a fixed position relative to the frame 200 and are sealed from contact with the environment.

Figure 3:
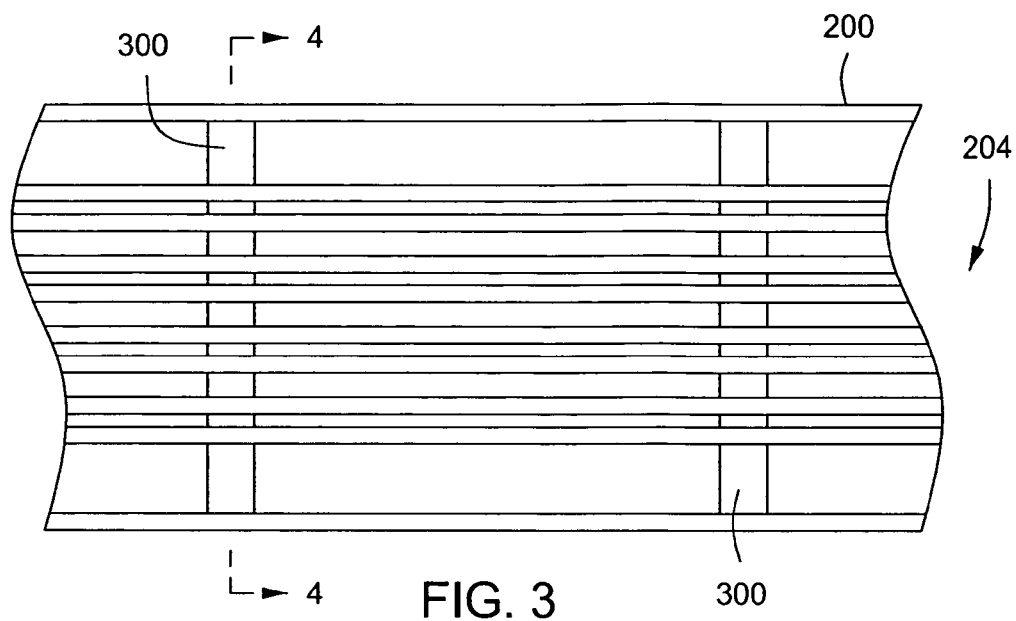
FIGS. 3, 4 and 5 together depict a procedure for assembling a mounting rail in accordance with one or more embodiments of the present invention.
Figure 4:
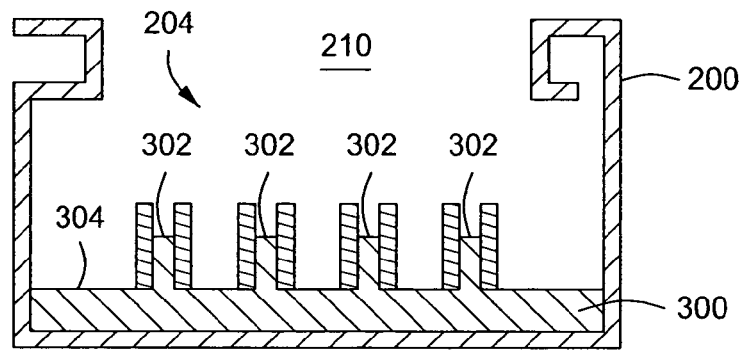
Figure 5:
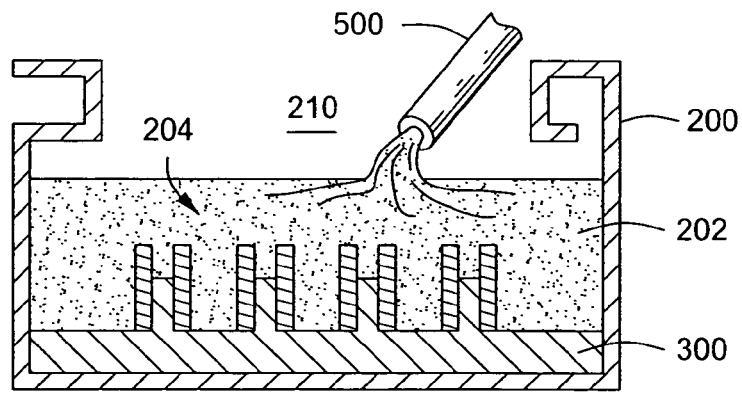

FIGS. 3, 4, and 5 together depict a procedure for assembling a mounting rail 108 in accordance with one or more embodiments of the present invention. FIG. 3 depicts a top plan view of the frame 200 containing the conductors 204 held in a fixed position by one or more stabilizing brackets 300. The stabilizing brackets 300 are formed of any nonconductive material, such as plastic, and are intermittently positioned along the length of the frame 200 to hold each bus bar of the conductors 204 in spaced apart relation to one another prior to the addition of the insulative material 202. Additionally or alternatively, other means, such as molded plastic clips, ribs extending within the frame 202, or the like, may be utilized to maintain the conductors 204 in a fixed position within the frame 200 prior to adding the insulative material 202.

FIG. 4 depicts a cross-sectional view 210 of FIG. 3 taken along lines 4-4 of FIG. 3. The stabilizing bracket 300 rests on the bottom of the frame 200. The conductors 204 are held in a vertical orientation via an adhesive placed along the stabilizing bracket 300; in other embodiments, the conductors 204 may additionally or alternatively be held in a vertical orientation by a different means, such as a slot of each of the conductors 204. Ribs 302 protrude from a base 304 of the stabilizing bracket 300 to maintain each bus bar of each conductor 204 in a spaced apart relation during a fill process for adding the insulative material 202.

FIG. 5 depicts the frame 200 being substantially filled with the insulative material 202. In some embodiments, the insulative material 202 may be discharged in an initial fluid state from a tube 500 during the fill process and subsequently harden. Once the insulative material 202 hardens, it maintains each conductor 204 in a spaced apart position along the entire length of the frame 200.

Figure 6:
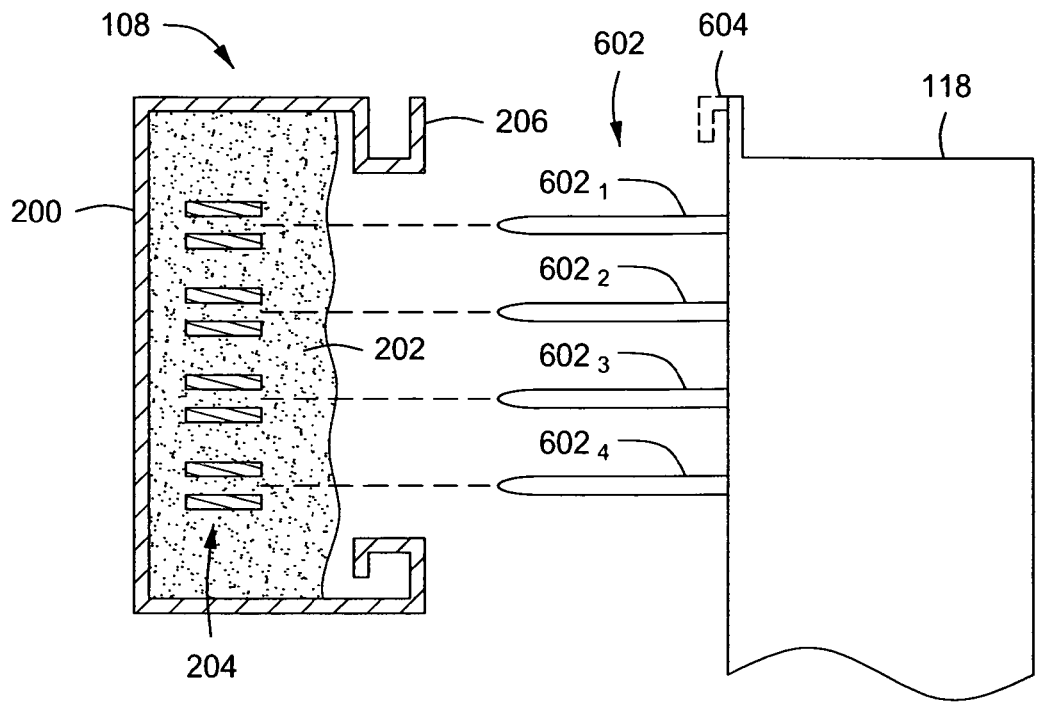
FIGS. 6 and 7 together depict a procedure for coupling an inverter to a mounting rail in accordance with one or more embodiments of the present invention.
Figure 7:
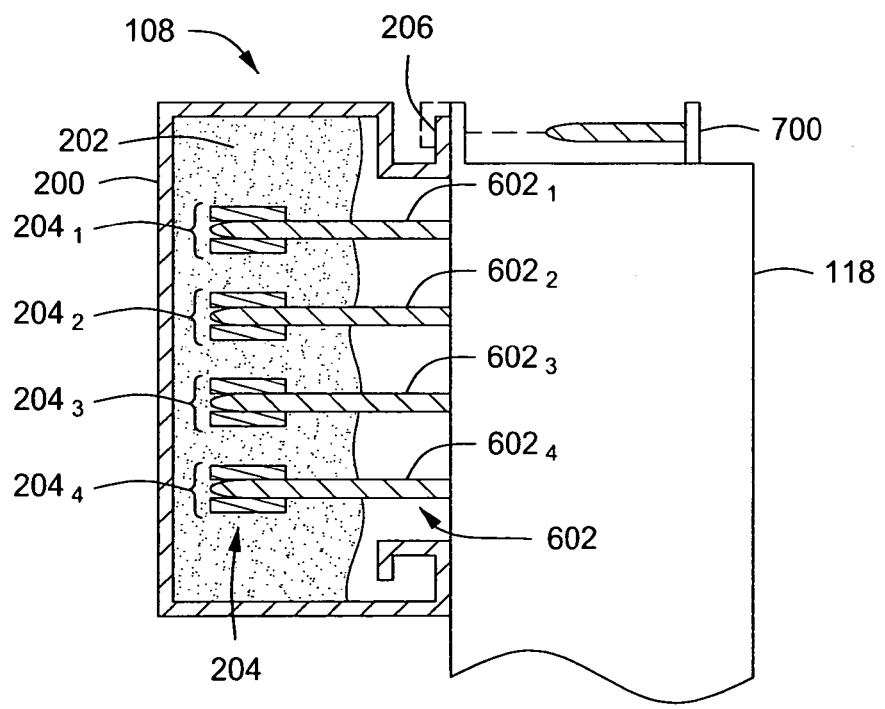

FIGS. 6 and 7 together depict a procedure for coupling an inverter 118 to a mounting rail 108 in accordance with one or more embodiments of the present invention. The inverter 118 may be part of an integrated PV module 106; alternatively, the inverter 118 may be electrically coupled to a PV module 120 although not physically integrated with the PV module 120 to form an integrated PV module 106. In some alternative embodiments, a DC/DC converter may be utilized in place of the inverter 118.

The inverter 118 comprises pins 602₁, 602₂, 602₃, and 602₄, collectively referred to as pins 602, for presenting output power from the inverter 118. The pins 602 are spaced similarly to spacing of the conductors 204 and are adapted to be pointed enough to penetrate the insulative material 202 and couple the output power to the conductors 204 (i.e., when the inverter 118 is coupled to the mounting rail 108, the inverter is pressed toward the mounting rail 108 and the pins 602 penetrate the insulative material 202 to make electrical contact with the connectors 204). Pin alignment markings can be positioned (e.g., printed) onto the surface of the insulative material 202 to ensure the pins 602 piece the insulative material 202 in correct location to facilitate connection with the connectors 204. Other alignment means, such as pins, slides, or the like may additionally or alternatively be utilized.

The pins 602 are of a shape (i.e., length and thickness) to make electrical contact with the connectors 204 via a sliding contact, where each pin 602 slides between the bus bars of a connector 204 and maintains contact with the bus bars. Generally, a gap between bus bars in a conductor 204 is fixed at a size that is slightly less than the pin diameter. As a result, the pins 602, upon contacting the bus bars of each conductor 204, slightly displace the bus bars and are maintained in solid contact with the bus bars due to the bus bar rigidity and the insulative material 202. When using a resilient insulative material, such as polyurethane or the like, the insulative material 202 may further seal around the pins 602 and against a sealant of the inverter 118, providing environmental protection for the electrical connections between the inverter 118 and the AC wiring distribution that the conductors 204 provide. In other embodiments, a sealant may be applied to each of the pins 602 and/or an O-ring may be placed on each of the pins 602 prior to assembly.

In some embodiments, the inverter 118 comprises an inverter flange 604, for example as part of the inverter's form factor, for mating with the mounting flange 206 or 208 such that the pins 602 are aligned with the conductors 204 prior to piercing the insulative material 202, For example, the inverter flange 604 may have an inverted U-shape with respect to the mounting flange 206, where the inverter flange 604 "hooks" onto the mounting flange 206 and the inverter 118 may be rotated along the vertical direction, causing the pins 602 to pierce the insulative material 202 and make electrical contact with the conductors 204. In some embodiments, the inverter flange 604 and the mounting flange 206 may each comprise a hole (e.g., a screw hole) for aligning the inverter 118 with the mounting rail 108 such that the pins 604 and the conductors 204 are properly aligned prior to the pins 602 piercing the insulative material 202. Additional and/or alternative techniques for ensuring the pins 602 and the conductors 204 are suitably aligned may also be utilized.

In some alternative embodiments, the conductors 204 may each be replaced by a single conductor for making electrical contact with the pins 602 (i.e., a different conductor for each of the pins 602) or with a different power output connector from the inverter 118.

FIG. 7 depicts an inverter 118 coupled to a mounting rail 108 in accordance with one or more embodiments of the present invention. The pins 602, after penetrating the insulative material 202, are conductively coupled to respective conductors 204 for providing AC power from the inverter to an output load via the conductors 204. One or more screws 700 may be used to secure the inverter flange 604 to the mounting flange 206 in order to maintain the inverter 118 in position on the mounting rail 108. Other means of retaining the inverter 118 may be used, such as clips, bolts/nuts, rivets, and the like.

In some embodiments, the insulative material 202 is resilient (e.g., polyurethane) such that the insulative material 202 "self seals" when the inverter 118 is removed and the pins 602 extracted. In other embodiments, where the insulative material 202 is not self sealing, holes remaining following removal of the inverter 118 can be filled, for example, with a prefabricated plug or a silicone caulking material to maintain an environment seal for the conductors 204.

FIG. 8 depicts a coupling mechanism 122 for coupling multiple mounting rails 108 in accordance with one or more embodiments of the present invention. The coupling mechanism 122 may be utilized to mechanically and electrically connect multiple mounting rails 108 in series (e.g., end-to-end in a horizontal direction) to facilitate mounting an extended horizontal sequence of PV panels 150.

Figure 8A:
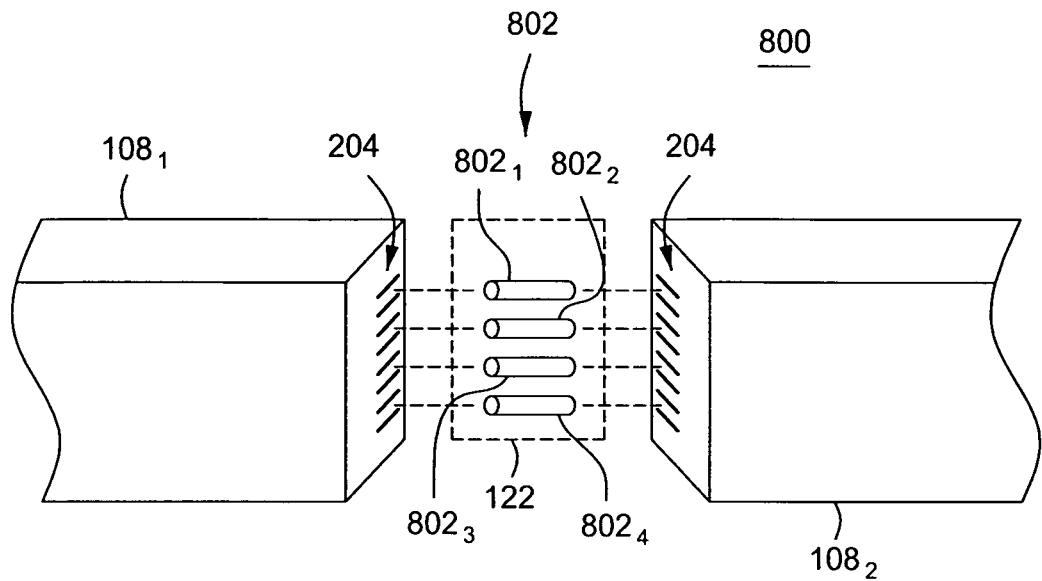
FIG. 8 depicts a coupling mechanism for coupling multiple mounting rails in accordance with one or more embodiments of the present invention.

FIG. 8A depicts an exploded, perspective view of one embodiment of the coupling mechanism 122 for coupling mounting rails $108_1$ and $108_2$. The coupling mechanism 122 comprises rail coupling pins $802_1$, $802_2$, $802_3$, and $802_4$, collectively known as rail coupling pins 802. The rail coupling pins 802 are installed into conductors 204 of each mounting rail $108_1$ and $108_2$ (i.e., one coupling pin 802 per each bus bar pair of the conductors 204), and the mounting rails $108_1$ and $108_2$ are butted together to coupled the conductors 204 of mounting rail $108_1$ to the conductors 204 of mounting rail $108_1$ via the rail coupling pins 802. FIG. 8A depicts four rail coupling pins 802, although the number of rails coupling pins 802 is based on the number of conductors 204 within a mounting rail 108. In some alternative embodiments, the rail coupling pins 802 may have an elongated U-shape for coupling mounting rails 108 that are vertically aligned.

Figure 8B:
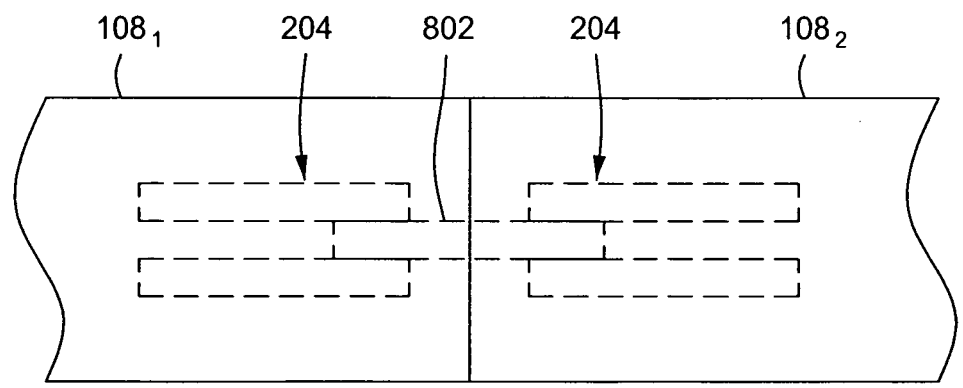

FIG. 8B depicts an assembled top view of conductors 204 of mounting rail $108_1$ coupled to conductors 204 of mounting rail $108_2$ via the rail coupling pins 802. Additionally, each cable 112 may be coupled to the conductors 204 of a mounting rail 108 in the same manner, or, from the top of the mounting rail 108.

Figure 9A:
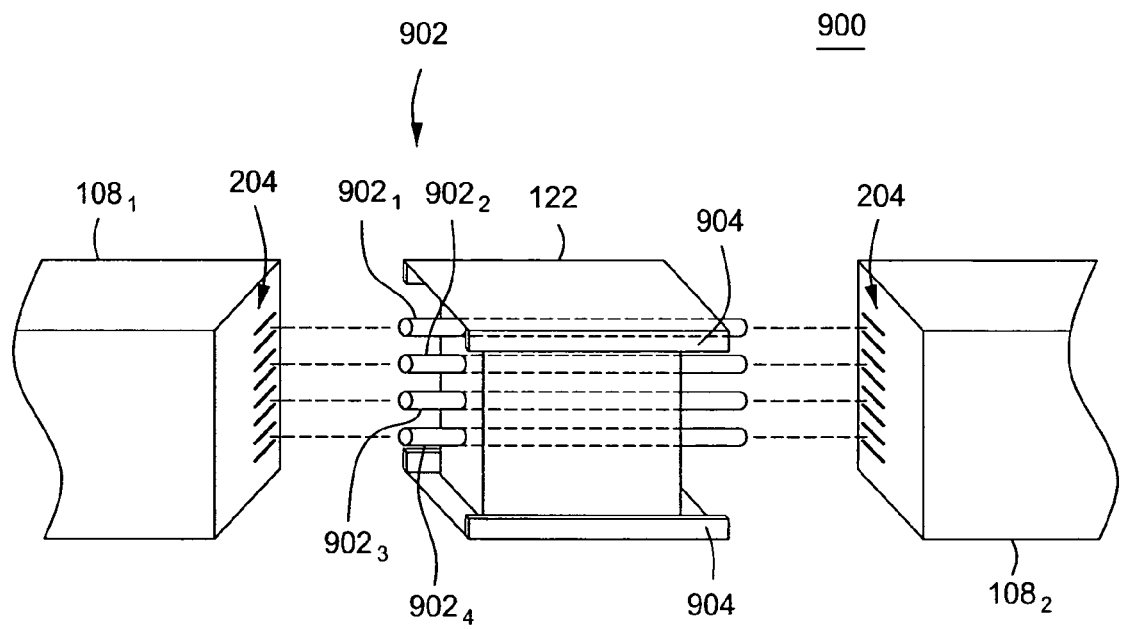
FIG. 9 depicts a coupling mechanism for coupling multiple mounting rails in accordance with one or more embodiments of the present invention.

FIG. 9 depicts a coupling mechanism 122 for coupling multiple mounting rails 108 in accordance with one or more embodiments of the present invention. FIG. 9A depicts an exploded, perspective view of one embodiment of the coupling mechanism 122 for coupling mounting rails $108_1$ and $108_2$. The coupling mechanism 122 has a cross-sectional form substantially similar to a cross-sectional form of the mounting rail 108. The coupling mechanism 122 comprises rail coupling pins $902_1$, $902_2$, $902_3$, and $902_4$, collectively known as rail coupling pins 902, disposed within a non-conductive solid material, such as silicone or the like. The rail coupling pins 902 are spaced similarly within the coupling mechanism 122 to the spacing of the conductors 204 within a mounting rail 108. The rail coupling pins 902 extend from opposing sides of the coupling mechanism 122 such that the rail coupling pins 902 are installed into the conductors 204 of each mounting rail $108_1$ and $108_2$ (i.e., one coupling pin 902 per each bus bar pair of the conductors 204) for coupling the corresponding conductors 204 of each mounting rail $108_1$ and $108_2$. The coupling mechanism 122 generally comprises one or more flanges 904 around at least a portion of the perimeter for securing the coupling mechanism 122 to the mounting rail frame 200, for example by adhesives, screws, snaps, or the like, and sealing the connections between the couplings pins 902 and the conductors 204 from environmental factors and foreign matter. Additionally, the insulative material 202 and the solid material within the coupling mechanism 122 may seal together when the coupling mechanism 122 is coupling to a mounting rail 108.

In some alternative embodiments, the rail coupling pins 902 may have an elongated U-shape, where each end (i.e., the top of the "U") extends from the same side of the coupling mechanism 122 for coupling mounting rails 108 that are vertically aligned.

Figure 9B:
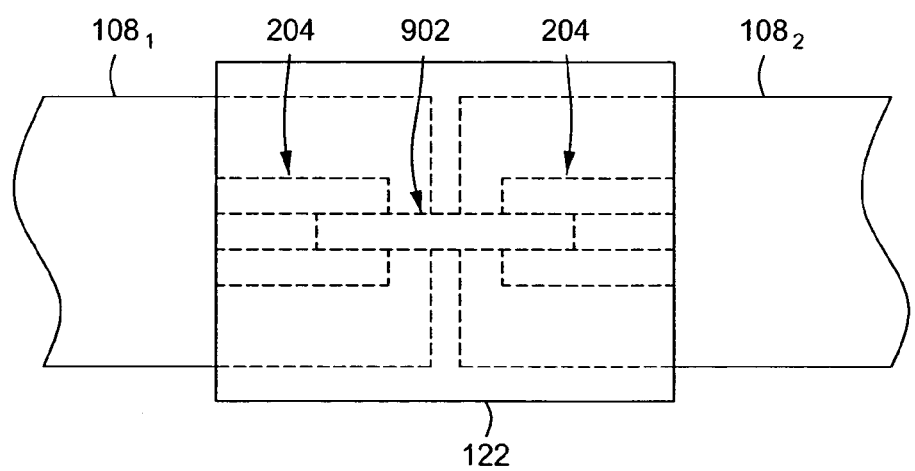

FIG. 9B depicts an assembled top view of conductors 204 of mounting rail 108₁ coupled to conductors 204 of mounting rail 108₂ via the coupling mechanism 122. Additionally, each cable 112 may be coupled to the conductors 204 of a mounting rail 108 in the same manner, or, from the top of the mounting rail 108.

Figure 10:
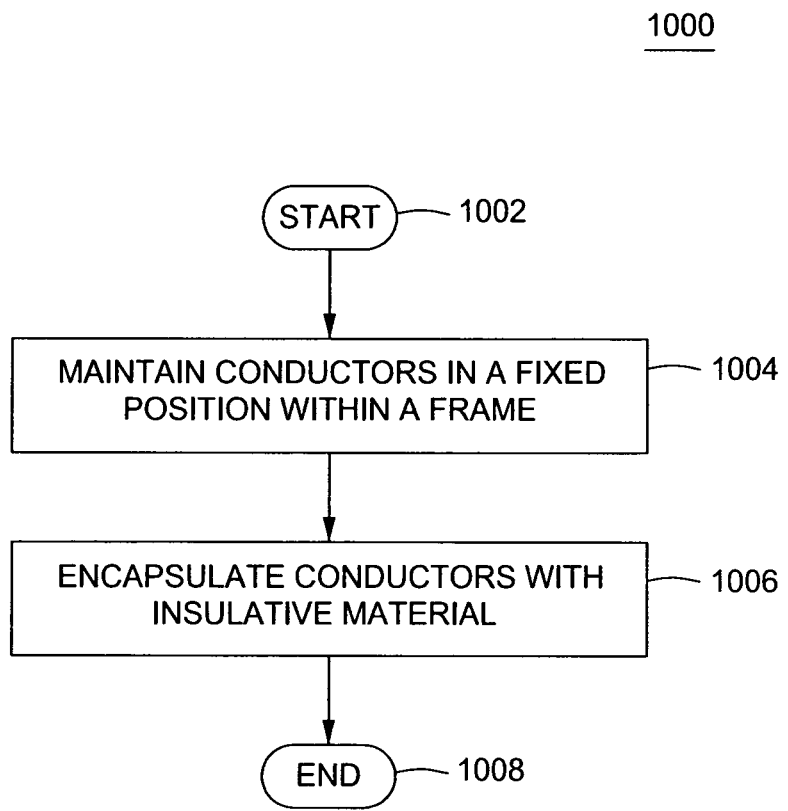
FIG. 10 is a flow diagram of a method for assembling a mounting rail in accordance with one or more embodiments of the present invention.

FIG. 10 is a flow diagram of a method 1000 for assembling a mounting rail in accordance with one or more embodiments of the present invention. The method 1000 begins at step 1002 and proceeds to step 1004. At step 1004, a desired number of conductors are maintained in a fixed position within a cavity of a mounting rail frame, such as the mounting rail frame 200. The desired number of conductors may be determined based on a type of power to be coupled by the conductors to an output load; for example, two conductors may be utilized to support DC power or single phase AC power. Alternatively, the mounting rail may be assembled with a set number of conductors, such as four conductors, where some conductors remain unused when the mounting rail is electrically coupled to a power element, such as a PV module, a DC junction box, a DC/DC converter, or a DC/AC inverter.

Generally each conductor comprises two conductive bus bars, although in some alternative embodiments each conductor may comprise a single conductive bus bar. The bus bars are formed of any suitable conductive material, such as copper, aluminum, or the like, and extend the length of the frame. The bus bars are maintained in a fixed spaced-apart position, for example by one or more stabilizing brackets as depicted in FIGS. 3 and 4, by ribs that are part of the form factor of the frame, by molded plastic clips, and/or similar techniques, to allow for an output connector (e.g., a pin connector) of a power module to be received between each pair of bus bars. Within each pair of bus bars, the bus bars are spaced apart at a distance slightly less than the diameter of an output pin of a power module to be mounted to the mounted rail. Such spacing ensures that, when disposed between the bus bars, the power element output pin maintains solid electrical contact with the bus bars.

The method 1000 proceeds to step 1006. At step 1006, at least a portion of the frame cavity is filled with an insulative material, such as the insulative material 202, such that the conductors are encapsulated within the insulative material. In some embodiments, the insulative material may be discharged into the cavity in a liquid state, as depicted in FIG. 5, and solidify over time. The method 1000 then proceeds to step 1008 where it ends.

While the foregoing is directed to embodiments of the present invention, other and further embodiments of the invention may be devised without departing from the basic scope thereof, and the scope thereof is determined by the claims that follow.

The invention claimed is:

1. A system for coupling generated power to an output load, comprising:
    a first mounting rail that structurally supports a photovoltaic module, wherein the photovoltaic module provides input power to a power element, for electrically coupling the power element to the output load, comprising:
    a frame defining a cavity;
    a plurality of conductors, disposed in the cavity, for coupling power from the power element to the output load; and
    an insulative material that substantially fills the cavity to encapsulate the plurality of conductors;
    wherein the frame comprises at least one mechanical connector for mounting the power element such that at least one power pin of the power element is aligned for piercing the insulative material and making electrical contact with the plurality of conductors.

2. The system of claim 1, wherein the plurality of conductors comprises at least one pair of elongated bus bars extending a length of the frame.

3. The system of claim 2, wherein bus bars in each pair of elongated bus bars are spaced apart from one another such that a corresponding power pin of the at least one power pin makes electrical contact with the bus bars after piercing the insulative material.

4. The system of claim 1, wherein each mechanical connector of the at least one mechanical connector is substantially U-shaped.

5. The system of claim 2, wherein the power element generates AC power and each pair of elongated bus bars either carries a phase of the AC power or forms a neutral line.

6. The system of claim 1, wherein the power element generates DC power and the plurality of conductors couple the DC power to the output load.

7. The system of claim 1, further comprising the power element.

8. The system of claim 7, wherein the power element is an inverter.

9. The system of claim 5, wherein the power element generates single-phase AC power.

10. The system of claim 3, further comprising a sealant for sealing the at least one power pin with the insulative material when the power element is coupled to the first mounting rail.

11. The system of claim 7, further comprising a coupling mechanism adapted for mechanically coupling a second mounting rail to the first mounting rail such that a second plurality of conductors within the second mounting rail are electrically coupled to the first plurality of conductors within the first mounting rail.

12. The system of claim 1, wherein the insulative material is a substantially resilient polymer having limited moisture absorption properties.

13. The system of claim 1, wherein the power element is a DC junction box, a DC/DC converter, or a DC/AC inverter.

14. A method for creating a mounting rail for coupling generated power to an output load, comprising:
    maintaining each conductor of a plurality of conductors in a spaced apart position within a cavity of a frame of the mounting rail, wherein the plurality of conductors are adapted for coupling output power from a power element to the output load, and wherein the mounting rail structurally supports a photovoltaic module that provides input power to the power element; and
    substantially filling the cavity with an insulative material such that the insulative material encapsulates the plurality of conductors; wherein the frame comprises at least one mechanical connector for mounting the power element such that at least one power pin of the power element is aligned for piercing the insulative material and making electrical contact with the plurality of conductors.

15. The method of claim 14, wherein the plurality of conductors comprises at least one pair of elongated bus bars extending a length of the frame.

16. The method of claim 15, wherein each mechanical connector of the at least one mechanical connector is substantially U-shaped.

17. The method of claim 14, wherein the power element is an inverter.

18. The method of claim 14, wherein the insulative material is a substantially resilient polymer having limited moisture absorption properties.

19. The method of claim 14, wherein the plurality of conductors are maintained in the spaced apart position from one another by at least one stabilizing bracket.

20. The method of claim 14, wherein the insulative material is substantially liquid during the filling process and hardens to insulate and maintain spacing of the plurality of conductors.

* * * * *